(12) United States Patent
Ligon

(10) Patent No.: US 6,630,721 B1
(45) Date of Patent: Oct. 7, 2003

(54) POLYSILICON SIDEWALL WITH SILICIDE FORMATION TO PRODUCE HIGH PERFORMANCE MOSFETS

(75) Inventor: William A. Ligon, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/571,823

(22) Filed: May 16, 2000

(51) Int. Cl.[7] .................. H01L 29/76; H01L 27/088
(52) U.S. Cl. .................. 257/413; 257/384; 257/388; 257/900
(58) Field of Search ................... 257/382, 383, 257/384, 388, 413, 900; 438/230, 303, 592, 595

(56) References Cited

U.S. PATENT DOCUMENTS

| | | | | |
|---|---|---|---|---|
| 4,587,718 A | * | 5/1986 | Haken et al. | 438/297 |
| 4,876,213 A | * | 10/1989 | Pfiester | 438/231 |
| 4,949,136 A | * | 8/1990 | Jain | 257/344 |
| 5,268,330 A | * | 12/1993 | Givens et al. | 438/586 |
| 5,672,544 A | | 9/1997 | Pan | 438/305 |
| 5,739,573 A | * | 4/1998 | Kawaguchi | 257/384 |
| 5,759,899 A | * | 6/1998 | Saito | 438/303 |
| 5,783,479 A | * | 7/1998 | Lin et al. | 438/592 |
| 5,851,890 A | * | 12/1998 | Tsai et al. | 438/303 |
| 5,920,783 A | * | 7/1999 | Tseng et al. | 438/305 |
| 5,981,383 A | | 11/1999 | Lur et al. | 438/655 |
| 6,010,954 A | * | 1/2000 | Ho et al. | 438/596 |
| 6,037,233 A | * | 3/2000 | Liu et al. | 438/304 |
| 6,046,105 A | | 4/2000 | Kittl et al. | 438/655 |
| 6,048,784 A | * | 4/2000 | Hong et al. | 438/592 |
| 6,069,032 A | * | 5/2000 | Lee | 438/197 |
| 6,100,173 A | | 8/2000 | Gardner et al. | 438/592 |
| 6,194,297 B1 | * | 2/2001 | Cheng | 438/592 |
| 6,359,321 B2 | * | 3/2002 | Shimizu et al. | 257/412 |
| 6,461,951 B1 | * | 10/2002 | Besser et al. | 438/592 |

FOREIGN PATENT DOCUMENTS

JP 4-05-198589 * 4/1993 ............ 257/900

OTHER PUBLICATIONS

International Search Report, application No. PCT/US 01/12359, mailed Feb. 5, 2002.

* cited by examiner

Primary Examiner—George Eckert
(74) Attorney, Agent, or Firm—Robert C. Kowert; Meyertons, Hood, Kivlin, Kowert & Goetzel, P.C.

(57) ABSTRACT

A MOSFET transistor having silicide formed on top of a polysilicon gate conductor, on partially exposed sidewalls of the polysilicon gate conductor, and on junction regions in an underlying semiconductor substrate is provided. Opposed sidewalls of the polysilicon gate conductor are surrounded by dielectric sidewall spacers. An upper surface of the dielectric spacers is lower than an upper surface of the polysilicon gate conductor thereby exposing a portion of the sidewall surfaces of the polysilicon gate conductor. A substantial portion of the polysilicon gate conductor, including the top of the gate and the exposed portion of the sidewall surfaces, may then be subjected to a salicidation process. During this process, salicide structures are also formed on the junctions regions. Therefore, silicide may be simultaneously formed on a substantial portion of the polysilicon gate and on junctions regions providing a gate with lower resistivity without consuming the junction regions during salicidation.

15 Claims, 5 Drawing Sheets

US 6,630,721 B1

POLYSILICON SIDEWALL WITH SILICIDE FORMATION TO PRODUCE HIGH PERFORMANCE MOSFETS

BACKGROUND OF THE INVENTION

1. Field of the Invention

This invention relates to semiconductor device manufacturing, and more particularly, to fabricating a MOSFET transistor having a polysilicon gate conductor with silicide formed simultaneously on top and sidewall surfaces of the gate conductor and on junction regions adjacent to the gate conductor without shorting the conductor to adjacent junctions or consuming the shallow junction regions.

2. Description of the Related Art

Fabrication of an integrated circuit involves numerous processing steps. Generally a dielectric material is formed upon a substrate, such as a monocrystalline silicon wafer. The gate conductor material is then formed upon the dielectric and subsequently patterned to expose the dielectric material deposited upon predetermined impurity regions residing in the semiconductor substrate. Patterning the gate conductor typically involves lithography in which a protective mask, photoresist, has been exposed to light and removed in the areas over the impurity regions prior to an etch process. Ion implantation may then be performed to form lightly doped drain ("LDD") and source/drain ("S/D") junctions in the impurity regions. Rapid thermal annealing is typically utilized to complete the formation of the LDD and source/drain junctions. After the impurity regions have been placed into a semiconductor substrate and gate regions defined upon the substrate, an interlevel dielectric may be formed across the topography to isolate the gate regions and the impurity regions. Processing steps may then be performed to create ohmic contacts which connect the gates and/or junctions to other devices in the integrated circuit.

Integrated circuits often employ active devices known as transistors. A transistor includes a pair of impurity regions, or junctions, spaced laterally apart by a gate conductor. The gate conductor is dielectrically spaced above a semiconductor substrate within which the junctions reside. The junctions contain dopants which are opposite in type to the dopants residing within a channel region of the substrate interposed between the junctions. The gate conductor typically comprises polycrystalline silicon ("polysilicon") which is rendered conductive by implanting dopants therein. Polysilicon can withstand relatively high temperatures. Therefore, a polysilicon gate conductor may be formed prior to performing high-temperature anneal steps, such as the post-implant anneal of the junctions. As such, the gate conductor may be patterned before the source and drain junctions are formed and annealed. In fact, the gate conductor is commonly used as a channel region mask during the formation of the source and drain junctions.

One of the disadvantages of using polysilicon as the gate conductor material, however, is that it inherently has a significantly higher resistivity than metals, such as aluminum. Therefore, the propagation delay of an integrated circuit employing a polysilicon gate conductor may be longer than desired. Consequently, the operational frequency that may be achieved by a circuit employing a polysilicon gate conductor may be somewhat limited. However, forming silicide upon a polysilicon gate conductor helps lower the sheet resistance of the gate conductor. Silicide formed upon polysilicon is generally referred to as polycide. A salicidation process involves depositing a refractory metal across the semiconductor topography, and then reacting the metal only in regions where a high concentration of silicon atoms are present. Therefore, dielectric sidewall spacers, formed on the sidewalls of a gate conductor prior to salicidation, prevent refractory metal from contacting, and hence reacting with, the sidewalls of the gate conductor. Absent the sidewall spacers, silicide may form upon the sidewall surfaces of the silicon-based gate conductors and undesirably short the gate conductors to adjacent junctions. The resulting silicide is, therefore, self-aligned to regions of high concentrations of silicon and is generally referred to as salicide. In this manner, salicides may be formed simultaneously upon the junctions and the top surface of the polysilicon gate conductors.

FIG. 1 depicts a transistor 10 having salicides formed simultaneously upon the junctions and the top surface of the polysilicon gate conductor. A polysilicon gate conductor 12 is spaced above a semiconductor substrate 14 by a gate dielectric 16. LDD regions 18 in the semiconductor substrate 14 extend laterally from opposed sidewalls 20 of the polysilicon gate conductor 12. The polysilicon gate conductor 12 is laterally surrounded by dielectric sidewall spacers 22 formed on opposed sidewalls 20 of the polysilicon gate conductor 12. The top of the polysilicon gate conductor 24 and the top of the junction regions 26 have been converted to silicide 28. Source/drain regions 30 in the semiconductor substrate 14 are spaced from the polysilicon gate conductor 12 by a width of the dielectric sidewall spacers 22.

As the dimensions of modern transistors shrink to accommodate the high demand for faster, more complex integrated circuits, the width of the transistor gates must also shrink. Consequently, a smaller surface area of the polysilicon gate conductor may be exposed to salicidation. Since silicide that is formed on the polysilicon gate conductor reduces the overall gate resistance, a greater thickness of the polysilicon may be converted to silicide to obtain an acceptable resistivity. Unfortunately, the thickness of polysilicon that may be converted to salicide is limited in conventional salicidation processing in which silicides are formed simultaneously on the gate conductor and the junctions of the transistor. As the dimensions of the transistors shrink, in addition to the width of the gate conductor, the depth of the source/drain junctions decreases. If a salicide process completely consumes a relatively shallow junction and penetrates into the substrate underneath the junction, a phenomenon known as "junction spiking" may occur. Junction spiking may undesirably cause the junction to exhibit large current leakage or cause the circuit to electrically short. Therefore, in order to prevent excessive consumption of shallow junctions, the thickness of the salicide formed on the junctions must be limited. Consequently, gate salicides formed simultaneously with junction salicides must also be of limited thickness.

Another disadvantage of polycide gate conductors is geometry-dependent resistivity. As the width of transistor gates is reduced, polysilicon gate conductors exhibit undesirable increases in resistivity. It has been theorized that regions of high resistivity polysilicon, in which mobile carriers become easily trapped, exist in the vicinity of the grain boundaries characteristic of polysilicon films. As these regions become comparable in size to the overall length of the polysilicon gate conductor, insufficient quantities of silicon may be available for the formation of high quality suicides. When such a condition occurs, the formation rate and quality of silicides formed on the upper surface of short-length polysilicon gate conductors may drop below the formation rate and quality of suicides formed on wider polysilicon structures. The increased resistivity exhibited by short-length gate conductor polycides results in an increased gate contact resistance, which reduces the speed of the transistor. Furthermore, geometry-dependent silicide resistivity is undesirable because semiconductor devices and processes are almost universally designed and simulated under the assumption that silicide resistivity will not exhibit a geometric dependence.

Accordingly, it would be advantageous to develop a salicidation process in which a larger portion of the polysilicon gate could be converted to silicide without shorting the conductors to adjacent junctions or consuming shallow source/drain junctions.

SUMMARY OF THE INVENTION

The problems outlined above are in large part solved by a transistor having silicide structures on a portion of the sidewalls of a gate conductor, and a method for fabricating this transistor. That is, a transistor is provided in which a substantial portion of a polysilicon gate conductor may be converted to silicide at the same time that silicide may be formed on exposed portions of the semiconductor substrate. Opposed sidewalls of the polysilicon gate conductor are surrounded by dielectric sidewall spacers. An upper surface of the dielectric sidewall spacers is lower than an upper surface of the polysilicon gate conductor thereby exposing a portion of the sidewall surfaces of the polysilicon gate conductor. In some embodiments, the height of exposed portion of the sidewall surfaces of the polysilicon gate conductor may be about two-thirds of the total gate conductor height. For example, a distance along the outer lateral surface of the dielectric sidewall spacers may be provided in order to sufficiently prevent silicide short-circuiting of the gate to the source/drain regions. In an embodiment, a distance of about 500 Å may be suitable for this purpose. Larger or smaller dielectric sidewall spacers may be appropriate in some embodiments, however, depending on the particular transistor length. A substantial portion of the polysilicon gate conductor, including the top of the gate conductor and the exposed portion of the sidewall surfaces, may then be subjected to a salicidation process. In this process, salicide structures may also be formed on the exposed portions of the semiconductor substrate. Therefore, using conventional salicidation processing a polysilicon gate conductor with lower resistivity may be formed while consumption of the junction regions or shorting of the gate conductor to the junction regions may be avoided.

In addition to a transistor as described above, a method of forming a transistor is contemplated herein. According to an embodiment, a polysilicon gate conductor may be formed above a gate dielectric layer formed upon a semiconductor substrate. The gate conductor is laterally bound between a pair of opposed sidewall surfaces. An LDD implant may be self-aligned to the opposed sidewall surfaces of the gate conductor to form LDD regions within the substrate spaced apart by a channel region. The gate conductor serves as a mask above the underlying channel region during the LDD implant. The dopant species used for the LDD implant is opposite in type to the dopant species residing in the channel region. Rapid thermal annealing is utilized to complete the formation of the LDD junctions.

A dielectric layer, such as silicon dioxide, may be formed on the polysilicon gate conductor and the gate dielectric. The dielectric layer may then be subjected to an anisotropic etch process in which first dielectric sidewall spacers are formed laterally adjacent the opposed sidewall surfaces of the polysilicon gate conductor. The etch process may remove a portion of the dielectric sidewall material such that the upper surface of the first dielectric sidewall spacers is lower than the upper surface of the polysilicon gate conductor. A portion of the polysilicon gate conductor sidewall, including the polysilicon gate conductor sidewall above the upper surface of the first dielectric sidewall spacer, is thereby exposed for subsequent processing. For example, in an embodiment, the etch process may remove a portion of the dielectric sidewall spacer such that the height of the exposed portion of the sidewall surfaces of the polysilicon gate conductor is about two-thirds of the total gate conductor height. Additionally, a distance along the outer lateral surface of the dielectric sidewall spacers may be provided in order to sufficiently prevent silicide short-circuiting of the gate to the source/drain regions. The gate dielectric over the junction regions may also be removed during the above etch process.

A refractory metal, such as cobalt or titanium, may then be deposited over the entire semiconductor substrate. The refractory metal may be heated to promote cross-diffusion and reaction between the metal atoms and silicon atoms of the polysilicon gate conductor and the junction regions. The refractory metal may, for example, be heated to a temperature of 600 to 800° C. for approximately 15 to 60 seconds using a technique known as rapid thermal processing ("RTP"). In this manner, a silicide comprising cobalt silicide or titanium silicide may be formed on the top of the gate conductor, the exposed portions of sidewalls of the gate conductor, and the junction regions in the semiconductor substrate adjacent the gate conductor. As such, the dielectric sidewall spacers are thick enough to prevent silicide bridging between the gate conductor and the junction regions which may cause shorting of the circuit, and salicidation may be terminated prior to consumption of the junctions. Any unreacted metal may then be removed.

Prior to forming the source/drain regions, a second dielectric sidewall spacer may be formed laterally adjacent the first dielectric sidewall spacers and exposed portions of the gate conductor sidewalls. A dielectric layer, such as silicon nitride, may be formed on the polysilicon gate conductor and the semiconductor substrate. The dielectric layer may then be subjected to an anisotropic etch process in which second dielectric sidewall spacers are formed laterally adjacent the exposed portions of the sidewall surfaces of the polysilicon gate conductor and the first dielectric sidewall spacers. A source/drain implant may then be self-aligned to the outer lateral edges of the second dielectric sidewall spacers.

A second ion implantation process may then be performed in order to form the source/drain regions. Rapid thermal annealing is utilized to complete the formation of the source/drain junctions. The S/D implant may be performed using the same type of dopant species as that used for the LDD implant, but at a higher does and energy than the LDD implant. Therefore, source and drain regions may be placed within the substrate a lateral spaced distance from the gate conductor. The LDD regions may be retained only in the semiconductor substrate beneath the sidewall spacers. An additional insulating material may now be deposited across the semiconductor substrate to complete the formation of a transistor.

In an alternative embodiment, second dielectric sidewall spacers may be formed prior to formation of the silicide and implantation of the source/drain regions. Implantation of the source/drain regions may then be performed prior to salicidation of the exposed portions of the polysilicon gate conductor and the exposed portions of the semiconductor substrate. The second dielectric sidewall spacers may then be removed by an etch process prior to salicide processing.

Alternatively, the formation of a second dielectric sidewall spacer may be eliminated in the above embodiment. Therefore, the source/drain implant may be self-aligned to the outer lateral edges of the first dielectric sidewall spacers. LDD regions may be located in the semiconductor substrate between the outer lateral edges of the gate conductor and the first dielectric sidewall spacers. Silicide may then be formed on exposed portions of the semiconductor substrate, including only the source/drain regions, because the LDD regions are substantially masked during salicidation by the first dielectric sidewall spacers. In this embodiment, silicide may also be formed prior to or subsequent to implantation of the source/drain regions.

In an alternative embodiment, LDD regions may be formed subsequent to the formation of the first dielectric sidewall spacers. The LDD regions may, therefore, be self-aligned to the outer lateral edges of the of the first dielectric sidewall spacers and laterally spaced from the gate conductor. Salicidation may then be performed as described in the above embodiment to form silicide on the top of the gate conductor, on the partially exposed sidewalls of the gate conductor, and on the exposed regions of the semiconductor substrate. In this embodiment, salicidation may also be performed as described above prior to forming the LDD regions in the semiconductor substrate. Second dielectric sidewall spacer formation and implantation of the source/drain regions may then be performed to complete the formation of the transistor.

In an additional embodiment, silicide may be formed on the gate and the junctions after the LDD and source/drain junctions have been formed. LDD regions may be formed in the semiconductor substrate laterally adjacent the polysilicon gate conductor. First dielectric sidewall spacers having an upper surface that is lower than an upper surface of the polysilicon gate conductor may then be formed on the opposed sidewall surfaces of the polysilicon gate conductor. The LDD regions may also be formed in the semiconductor substrate subsequent to first dielectric sidewall spacer formation thereby providing LDD regions that are laterally spaced from the gate conductor. The second dielectric sidewall spacers may then be formed as described in an above embodiment. An overetch step may be included to provide an upper surface of the second dielectric sidewall spacers that is lower than an upper surface of the polysilicon gate conductor thereby exposing a portion of the gate conductor sidewalls. Implantation of the source/drain regions may then be performed as described in an above embodiment. In embodiments for which the LDD regions are formed adjacent the gate conductor, the source/drain implants may also be performed after formation of the first dielectric sidewall spacers and prior to second dielectric sidewall spacer formation. Salicidation of the gate and source/drain materials may then be performed as described in the above embodiments to form silicide on the top of the gate conductor top, on the partially exposed sidewalls of the gate conductor, and on the source and drain regions.

In addition to the method described above, a transistor is contemplated herein in which a substantial portion of a polysilicon gate conductor has been converted to silicide. In an embodiment, a polysilicon gate conductor is spaced above a semiconductor substrate by a gate dielectric layer. LDD regions in the semiconductor substrate may extend laterally from the polysilicon gate conductor sidewalls. LDD regions in the semiconductor substrate may also be laterally spaced from the polysilicon gate conductor. The polysilicon gate conductor may be laterally surrounded by first dielectric sidewall spacers formed on opposed sidewalls of the polysilicon gate conductor. The first dielectric sidewall spacers have an upper surface that is lower than an upper surface of the polysilicon gate conductor such that exposed portions of the polysilicon gate conductor sidewalls are interposed between the two upper surfaces. Silicide may be formed on the upper surface of the polysilicon gate conductor and on the exposed portions of the polysilicon gate conductor sidewalls. Silicide may also be formed on exposed portions of the semiconductor substrate including upper surfaces of the source/drain and LDD regions. Alternatively, silicide may be formed on the exposed portions of the semiconductor substrate including only the upper surfaces of the source/drain regions. Second dielectric sidewall spacers may laterally extend from the first dielectric sidewall spacers and the exposed portions of the polysilicon gate conductor sidewalls. Second dielectric sidewall spacers may also have an upper surface that is lower than an upper surface of the polysilicon gate conductor such that exposed portions of the polysilicon gate conductor sidewalls are interposed between the upper surfaces of the first and second dielectric sidewall spacers. Source/drain regions in the semiconductor substrate may extend laterally from outer surfaces of the second dielectric sidewall spacers. Additionally, source/drain regions in the semiconductor substrate may extend laterally from outer surfaces of the first dielectric sidewall spacers.

The formation of silicide on a portion of the sidewalls of the gate conductor, in addition to the top surface of the gate conductor, may provide several advantages over standard salicidation processing. Exposing a greater surface area of the polysilicon gate conductor to salicidation may provide a polysilicon gate conductor with adequate resistivity to meet the performance requirements of modern transistors despite the reduced dimensions of the gates. Formation of silicide on a portion of the sidewalls of the gate conductor may also serve to strengthen the polysilicon gate conductor material. As the length of MOSFET transistors approaches 100 $\mu$m and below, the crystalline structure of the gate conductor may be only a few grains wide. Processing conditions, such as temperature changes, pressure waves from ultrasonic baths and exposure to aggressive chemicals, may cause the thin polysilicon gates to break at weak crystalline points. By converting a larger percentage of the gate conductor to silicide, the gate conductor may be less susceptible to damage caused by subsequent processing.

By forming salicide on a portion of the sidewalls of the gate conductor, in addition to the top surface, salicide may also be simultaneously formed on the junction regions of the transistor without consuming the entire thickness of the junctions. As modem transistors shrink, the source/drain junctions may also become shallower. Therefore, the capability to simultaneously form an adequate amount of salicide on the gate conductor in order to achieve the requirements for the gate resistivity without consuming the shallower junctions will become more difficult and more critical in the successful fabrication of modem transistors. Very shallow source/drain junctions may also become difficult to form using conventional implantation equipment. Silicide formation on the source/drain regions may serve to enable the formation of very shallow junctions while eliminating the need to continuously lower the implantation energy. A process involving higher implantation energy will be better controlled and make use of existing equipment for future generations of transistor devices.

Successfully forming adequate silicide on the gate conductor and junction regions prior to ion implantation in the junction regions may provide additional advantages. For example, implanting the source/drain regions after silicide formation may eliminate a substantial loss of dopant from the surface of the junction regions during subsequent rapid thermal processing. Additionally, silicide that is formed on the sidewalls of a gate conductor prior to implantation may be used as a sidewall spacer for subsequent implantation processes. The thickness of the silicide formation on the sidewalls of the gate conductor may be controlled by varying the metal to silicide formation/conversion temperatures. Therefore, by controlling the phase transition, for example from $Co_2Si$ to $CoSi$ or from $CoSi$ to $Co_2Si$, the thickness of the silicide may also be controlled. In this manner, the placement of the LDD and the source/drain regions by subsequent implantation in the semiconductor substrate may be adjusted. Thus, an advanced process control strategy, in which the phase transition during the salicidation process is strategically controlled, may be used to control the depth and the placement of the LDD and source/drain formation according to the critical dimension criteria for a particular transistor.

BRIEF DESCRIPTION OF THE DRAWINGS

Other objects and advantages of the invention will become apparent upon reading the following detailed description and upon reference to the accompanying drawings in which.

Figure 1:
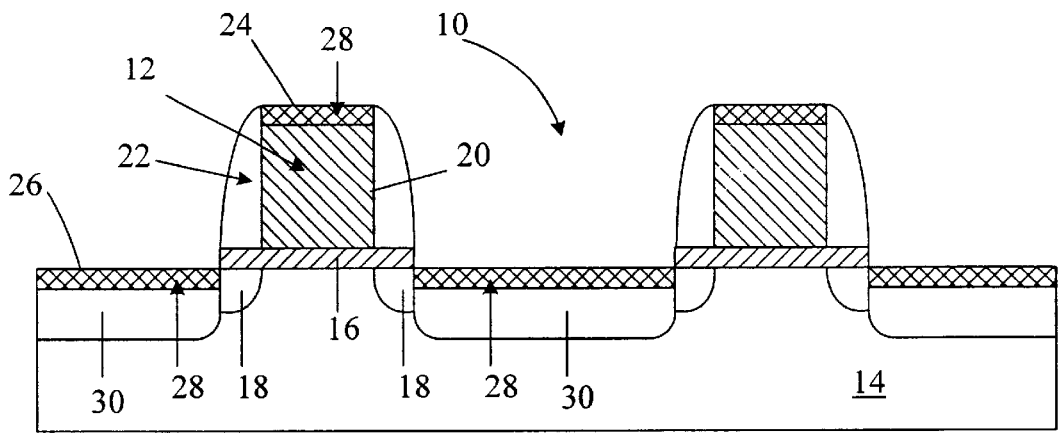
FIG. 1 depicts a partial cross-sectional view of a semiconductor topography in which a metal silicide is formed on top of a polysilicon gate and on source/drain regions.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Figure 2:
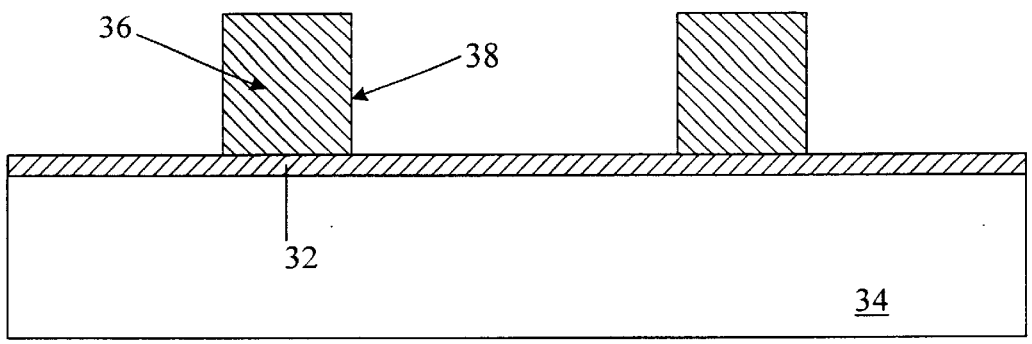
FIG. 2 depicts a partial cross-sectional view of a semiconductor topography in which polysilicon gate conductors are formed on a semiconductor substrate and are spaced above the semiconductor substrate by a gate dielectric layer.

Turning to the drawings, an exemplary embodiment of a method for fabricating a transistor is shown in FIGS. 2–8. FIG. 2 depicts a semiconductor topography in which a gate dielectric layer 32 has been formed over a semiconductor substrate 34. Semiconductor substrate 34 may preferably be silicon, and is doped either n-type (for producing a p-channel transistor) or p-type (for an n-channel transistor). More specifically, substrate 34 may be an epitaxial silicon layer grown on a monocrystalline silicon substrate, or an n-type or p-type well region formed in a monocrystalline silicon substrate. Dielectric layer 32 may preferably be thermally grown silicon dioxide which may be grown by heating the substrate 34 to a temperature of greater than about 700° C. in an oxidizing ambient such as $O_2$ or $H_2O$. Gate dielectric layer 32 may also include deposited $SiO_2$. Other dielectrics may be used, however, including silicon nitride, silicon oxynitride or nitrided silicon dioxide. In addition, dielectric layer 32 may be formed from a high-permittivity ("high-k") dielectric. Appropriate materials for a high-k gate dielectric include, but are not limited to, tantalum pentoxide ($Ta_2O_5$), barium titanate ($BaTiO_3$), and titanium oxide ($TiO_2$). A conductive layer of polysilicon (not shown) may be deposited upon the gate dielectric layer 32, for example, using chemical vapor deposition (CVD) of silicon from a silane source. Gate conductors 36 may be patterned, typically by lithography and etch techniques, upon the gate dielectric layer 32. Preferably, a plasma etch may be used to remove portions of the polysilicon layer to form gate conductors 36. In such an embodiment, the plasma etch duration may be selected to terminate before substantial portions of gate dielectric layer 32 are removed. As a result of the etch, substantially vertical opposed sidewall surfaces 38 may be defined as the lateral boundaries of gate conductor 36.

Figure 3:
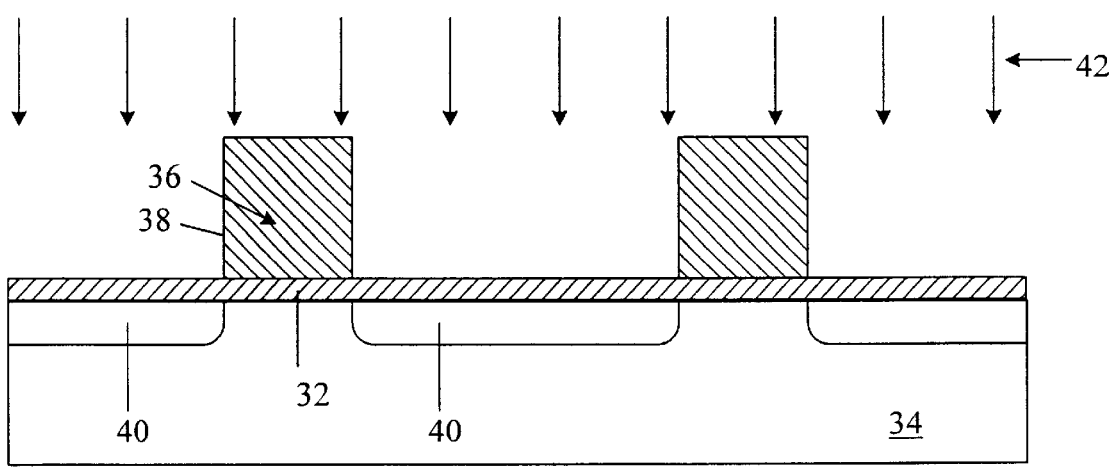
FIG. 3 depicts a partial cross-sectional view of a semiconductor topography in which LDD regions have been formed in the semiconductor substrate laterally extending from a channel region masked by the polysilicon gate conductors.

FIG. 3 illustrates the formation of source-side and drain-side LDD regions 40. LDD regions 40 may be formed self-aligned to the opposed sidewall surfaces 38 of the gate conductors 36 using an LDD implant 42. The formation of an NMOS transistor requires an LDD implant of n-type dopants into a p-type substrate, and the formation of a PMOS transistor requires an LDD implant of p-type dopants into an n-type substrate. Appropriate n-type species include, but are not limited to, arsenic and phosphorus, and appropriate p-type species include, but are not limited to, boron and boron difluoride. It is to be understood that both NMOS and PMOS transistors may be formed within a unitary substrate having n-type and p-type active regions to form a CMOS circuit by masking the ensuing NMOS active regions while implanting p-type dopants into the ensuing PMOS active regions, and vice-versa.

Figure 4:
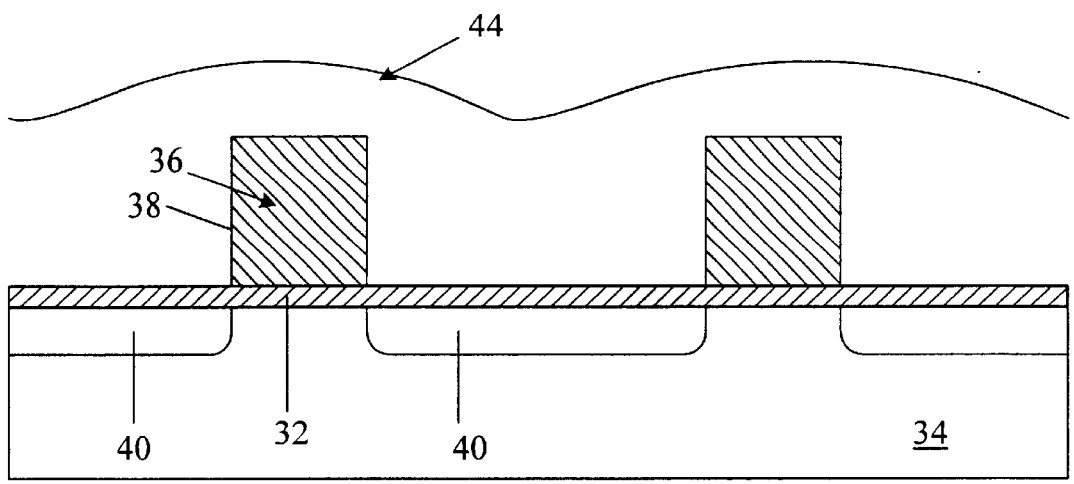
FIG. 4 depicts a partial cross-sectional view of a semiconductor topography in which a layer of insulating material is formed over the semiconductor topography.

Turning to FIG. 4, a layer of a dielectric material 44 may be deposited over the entire semi conductor topography. Dielectric layer 44 may typically be silicon dioxide deposited by CVD. In particular, decomposition of tetraethyl orthosilicate (TEOS) may be performed in a plasma-enhanced CVD (PECVD) reactor at a substrate temperature in the range from about 200° C. to about 500° C. to produce a very conformal film. Other techniques which may be used to deposit silicon dioxide for dielectric layer 44 include PECVD using a silane source, and atmospheric-pressure CVD (APCVD) and low-pressure CVD (LPCVD) using silane or TEOS sources. Dielectric layer 44 may also be formed from a different dielectric, such as silicon nitride or silicon oxynitride. In an alternative embodiment, dielectric 44 may be formed from a low-permittivity ("low-k") dielectric, generally known in the art as a dielectric having a dielectric constant of less than about 3.5. One low-k dielectric in current use which is believed to make a conformal film is fluorine-doped silicon dioxide. Dielectric layer 44 is thick enough such that the trench formed by facing sidewalls of gate conductors 36 may be completely filled with dielectric.

Figure 5:
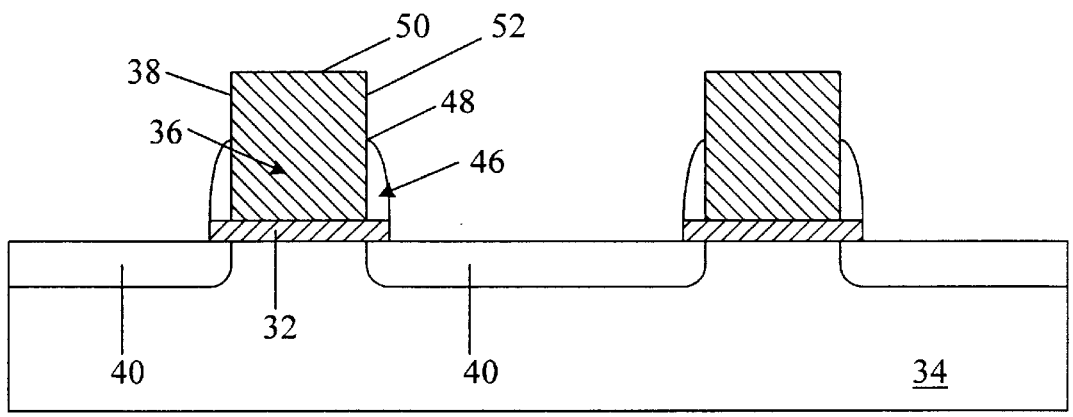
FIG. 5 depicts a partial cross-sectional view of a semiconductor topography in which first dielectric sidewall spacers have been formed on the sidewalls of the polysilicon gate conductors to expose an upper portion of the sidewalls, and in which exposed portions of the gate dielectric layer have been removed.

FIG. 5 illustrates a first pair of dielectric sidewall spacers 46 formed upon the opposed sidewall surfaces 38 of gate conductor 36. The formation of dielectric sidewall spacers 46 involves anisotropically etching the horizontally oriented surfaces of the dielectric material at a faster rate than vertically oriented surfaces. As a result of the etch process, the dielectric material 44 may only be retained laterally adjacent the sidewall surfaces 38 of gate conductor 36 in the form of sidewall spacers 46. The anisotropic etch process may remove a portion of the dielectric sidewall material 44 such that the upper surface 48 of the dielectric sidewall spacers 46 is lower than the upper surface 50 of the polysilicon gate conductor 36 thereby exposing a portion 52 of the gate conductor sidewalls 38. In some embodiments, the height of exposed portions 52 may be about two-thirds of the total gate conductor 36 height. For example, a distance of about 500 Å along the outer lateral surface of spacer 46 is currently believed to be sufficient to prevent silicide short-circuiting of the gate to the source/drain regions. Larger or smaller spacers 46 may be appropriate in some embodiments, however, depending on the particular transistor length. The lateral thickness of each sidewall spacer 46 may be controlled by altering the processing conditions, such as deposition time, during the deposition of dielectric material 44. The exposed portions of gate dielectric layer 32 may also be removed by this etch process to expose the substrate 34 above LDD regions 40.

Figure 6:
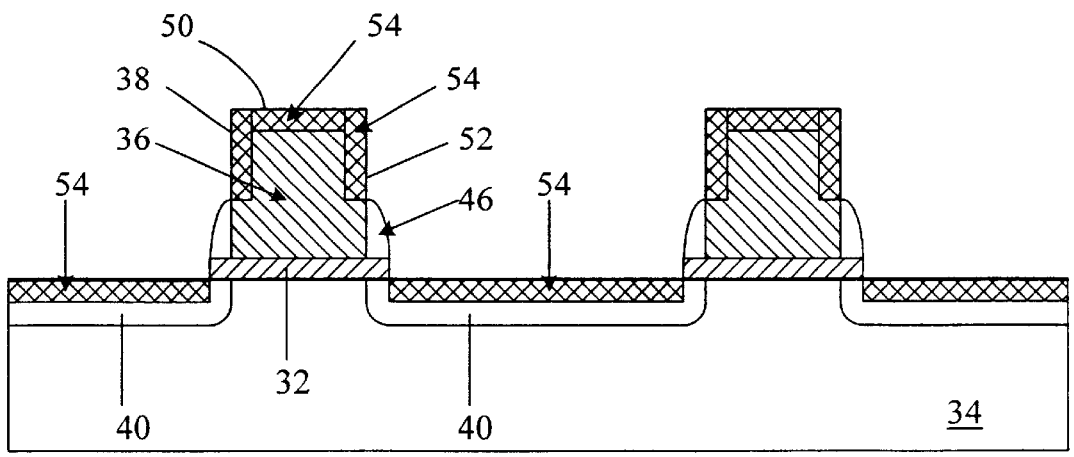
FIG. 6 depicts a partial cross-sectional view of a semiconductor topography in which silicide has been formed on top of the polysilicon gates, on a portion of the sidewalls of the polysilicon gates, and on the exposed regions in the semiconductor substrate.

As shown in FIG. 6, a silicide 54 may be formed on the upper surface 50 of the polysilicon gate conductor 36, the exposed portion 52 of the gate conductor sidewalls, and the upper surface of the LDD regions 40. To form the silicide, a layer of refractory metal (not shown) may be deposited across the exposed surfaces of gate conductor 36, sidewall spacers 46, and LDD regions 40. The refractory metal may be sputter deposited from a metal target or MOCVD (i.e., metal organic CVD) deposited from a source comprising a volatile metal organic compound. Appropriate refractory metals include, but are not limited to, cobalt and titanium. The layer of refractory metal may be subjected to radiation to cause the metal atoms of the first layer of refractory metal to undergo cross-diffusion and reaction with silicon atoms within polysilicon gate conductor 36 and LDD regions 40. This radiation may be thermal radiation supplied from an anneal furnace. Preferably, the radiation is radiant light supplied from an arc lamp or a tungsten-halogen lamp using RTP. The RTP may be performed for approximately 15 to 60 seconds at a temperature of 600 to 800° C. The presence of the dielectric sidewall spacers 46 on a portion of the sidewalls 38 of the gate conductor 36 may inhibit the metal atoms from interacting with silicon atoms arranged within this portion of the gate conductor. As a result of the anneal step, the top and exposed sidewall portions, 50 and 52 respectively, of polysilicon gate conductor 36 and a portion of LDD regions 40 may be converted to silicide 54. Refractory metal that is not consumed during this salicidation process may be removed, for example, using a selective etch technique. The resulting silicide 54 comprises, for example, $TiSi_2$ if Ti is used as the refractory metal or $CoSi_2$ if Co is used as the refractory metal.

Figure 7:
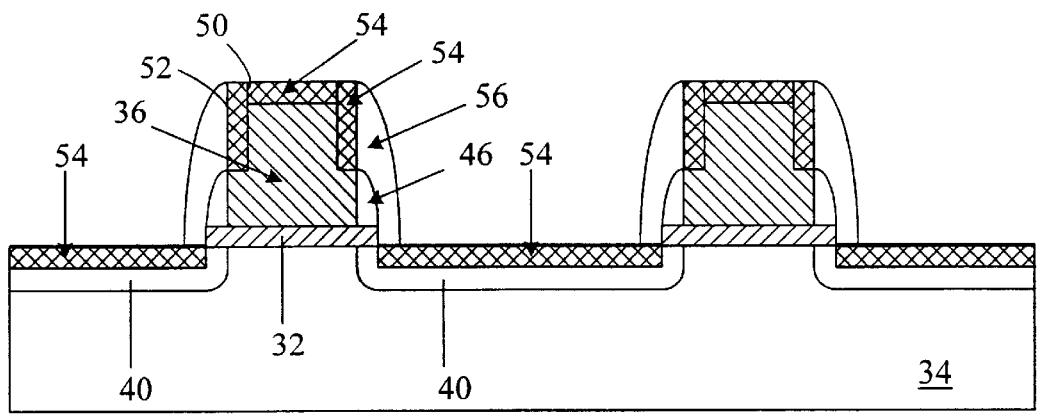
FIG. 7 depicts a partial cross-sectional view of a semiconductor topography in which second dielectric sidewall spacers have been formed on the polysilicon gate conductors laterally adjacent to the first dielectric sidewall spacers and exposed portions of the polysilicon gate conductor sidewalls.

As shown in FIG. 7, a pair of dielectric sidewall spacers 56 may be formed upon the opposed sidewall surfaces of gate conductor 36. As described for the formation of the dielectric sidewall spacers 46 above, the formation of dielectric sidewall spacers 56 involves first depositing a dielectric layer (not shown) across the semiconductor substrate 34. This dielectric layer is typically silicon nitride deposited by CVD. The dielectric layer, however, may comprise any of the dielectric materials described above. This dielectric layer may also typically have etch selectivity with respect to dielectric layer 44 to allow selective removal of the dielectric sidewall spacers, 46 and 56, respectively, if desired. Deposition of the dielectric layer may preferably include chemical vapor deposition. Any of the deposition techniques described above, however, may also be used to form this dielectric layer. The horizontally oriented surfaces of the dielectric material are then anisotropically etched at a faster rate than vertically oriented surfaces. As a result of the etch, the dielectric material is only retained laterally adjacent the sidewall surfaces of gate conductor 36 in the form of dielectric sidewall spacers 56. The lateral thickness of each dielectric sidewall spacer 56 may be controlled by altering the processing conditions, such as deposition time, during the deposition of the dielectric material.

Figure 8:
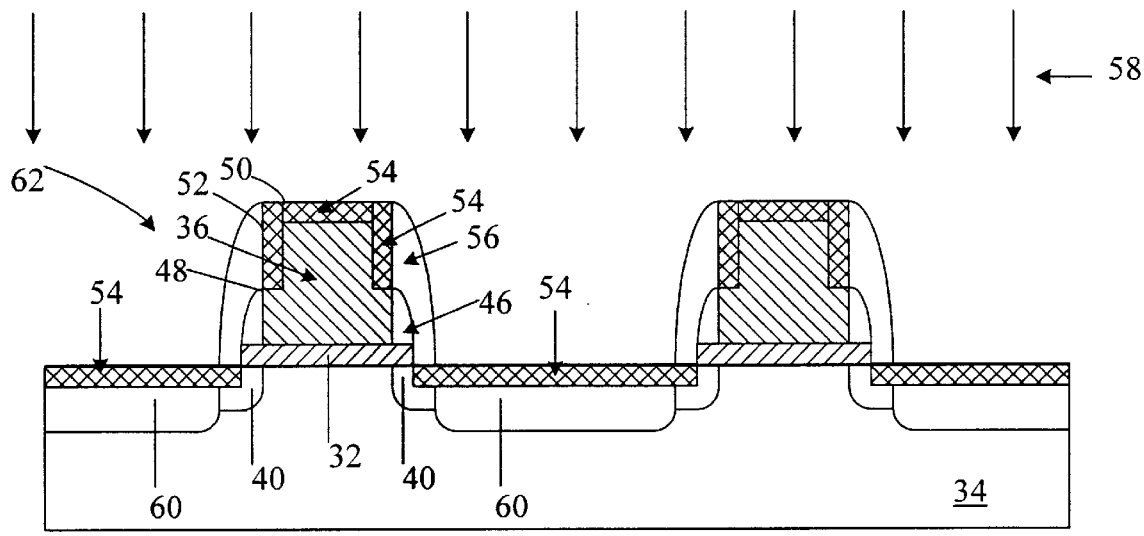
FIG. 8 depicts a partial cross-sectional view of a semiconductor topography in which source/drain regions have been implanted in the semiconductor substrate laterally extending from outer lateral edges of the second dielectric sidewall spacers.

As shown in FIG. 8, a source/drain implant 58 may then be performed at a higher dose and energy than the LDD implant through the silicide structures 54 residing on the junction regions 40. The S/D implant-may be self-aligned to the outer lateral surfaces of sidewall spacers 56. In this manner, source/drain regions 60 may be formed within substrate 34 a spaced distance from gate conductor 36. As such, LDD regions 40, which contain a lighter concentration of dopant than source and drain regions 60, may remain only in the lateral regions beneath the first and second sidewall spacers, 46 and 56 respectively. Together, LDD regions 40 and source/drain regions 60 form graded junctions which increase in concentration in a lateral direction away from gate conductor 36. An interlevel dielectric may be subsequently deposited across the topography, followed by the formation of conductive plugs to the silicide gate conductor 36 and/or the silicide structures 54 residing upon the source and drain regions.

FIG. 8 also illustrates a transistor 62 formed according to an above embodiment. A polysilicon gate conductor 36 is spaced above a semiconductor substrate 34 by a gate dielectric 32. LDD regions 40 in the semiconductor substrate 34 may extend laterally from the polysilicon gate conductor 36 sidewalls. The polysilicon gate conductor 36 may be laterally surrounded by first dielectric sidewall spacers 46 formed adjacent to opposed sidewalls of the polysilicon gate conductor 36. The first dielectric sidewall spacers 46 may have an upper surface 48 that is lower than an upper surface 50 of the polysilicon gate conductor 36 such that exposed portions 52 of the polysilicon gate conductor 36 sidewalls are interposed between the two upper surfaces 48 and 50, respectively. In some embodiments, the height of exposed portions 52 is about two-thirds of the total gate conductor 36 height. For example, a distance of about 500 Å along the outer lateral surface of spacer 46 may be sufficient to prevent silicide short-circuiting of the gate 36 to source/drain regions 60. Larger or smaller spacers 46 may be appropriate in some embodiments, however, depending on the particular transistor length. Silicide 54 may be arranged on the upper surface 50 of the polysilicon gate conductor 36 and on the exposed portions 52 of the polysilicon gate conductor 36 sidewalls. Silicide 54 may also be arranged on upper surfaces of the LDD regions 40 and source/drain regions 60. Second dielectric sidewall spacers 56 laterally extend from the first dielectric sidewall spacers 46 and the exposed portions 52 of the polysilicon gate conductor 36 sidewalls. Source/drain regions 60 in the semiconductor substrate 34 may extend laterally from outer surfaces of the second dielectric sidewall spacers 56.

Figure 9:
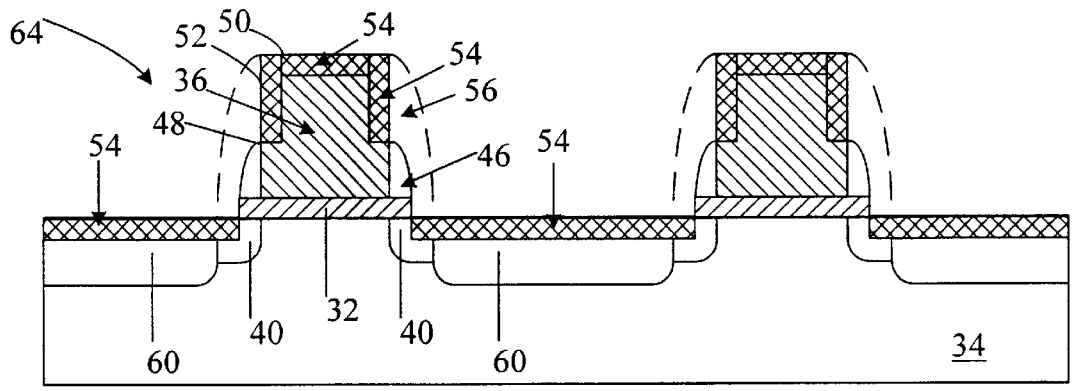
FIG. 9 depicts a partial cross-sectional view of a semiconductor topography in an alternative embodiment, in which source/drain regions have been implanted in the semiconductor substrate self-aligned to outer lateral edges of the second dielectric sidewall spacers and the second dielectric sidewall spacers have been removed subsequent to implantation.

In an alternative embodiment, shown in FIG. 9, second dielectric sidewall spacers 56 may be formed prior to forming silicide 54 on exposed portions of the polysilicon gate conductor 36 and the semiconductor substrate 34. Implantation of source/drain regions 60, therefore, may also be performed prior to salicidation. In this embodiment, second dielectric sidewall spacers 56 may be removed prior to salicidation by an etch process. Silicide 54 may then be formed on the exposed portion of the polysilicon gate conductor and on the exposed regions of the semiconductor substrate.

FIG. 9 also depicts a transistor 64 that may be formed according to an embodiment in which second dielectric sidewall spacers 56 have been removed prior to salicidation. LDD regions 40 may be self-aligned in semiconductor substrate 34 between the outer lateral edge of gate conductor 36 and the position of the outer lateral edge of second dielectric sidewall spacers 56 before removal (as shown by the dashed line). Source/drain regions 60 in semiconductor substrate 34 may be adjacent to and extend laterally from LDD regions 40. Silicide 54 may be arranged on the upper surface 50 of the polysilicon gate conductor 36 and on the exposed portions 52 of the polysilicon gate conductor 36 sidewalls. Silicide 54 may also be arranged on a portion of the upper surface of LDD regions 40 and substantially the entire upper surface of source/drain regions 60.

Figure 10:
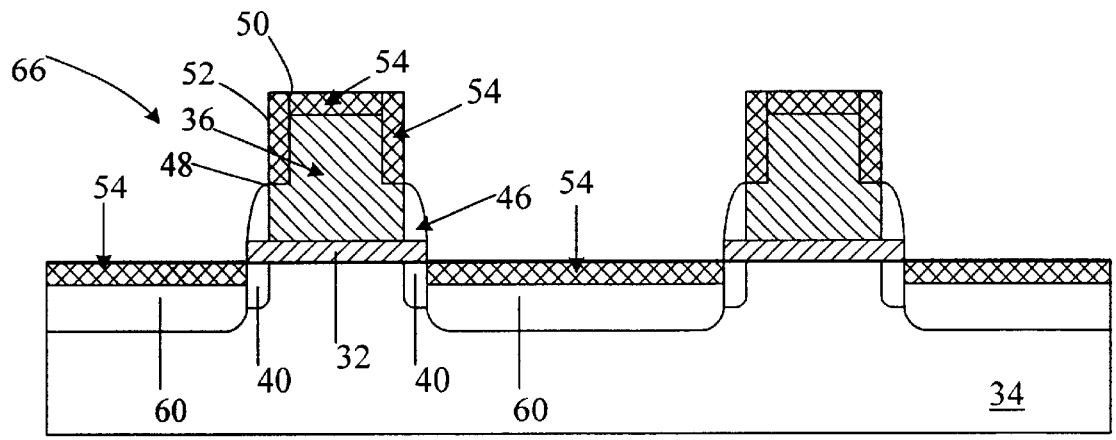
FIG. 10 depicts a partial cross-sectional view of a semiconductor topography in an alternative embodiment, in which LDD regions in the semiconductor substrate extend laterally from the polysilicon gate conductor, source/drain regions in the semiconductor substrate extend laterally from first dielectric sidewall spacers, and silicide has been formed on exposed regions of the semiconductor substrate including only the source/drain regions.

In another embodiment, which is shown in FIG. 10, source/drain regions 60 may also be formed self-aligned to the first dielectric sidewall spacers 46 by eliminating the formation of the second dielectric sidewall spacers 56. LDD regions 40 may then be self-aligned in the semiconductor substrate 34 between the outer lateral edges of the gate conductor 36 and the first dielectric sidewall spacers 46. Silicide 54 may then be formed on exposed portions of the semiconductor substrate 34 including only the source/drain regions 60, because LDD regions 40 are substantially masked during salicidation by first dielectric sidewall spacers 46. In this embodiment, silicide 54 may be formed prior to or subsequent to implanting source/drain regions 60.

FIG. 10 also illustrates a transistor 66 that may be formed according to an above embodiment. The second dielectric sidewall spacers may be eliminated in transistor 66. Source/drain regions 60 may extend laterally from outer lateral edges of first dielectric sidewall spacers 46 instead of extending laterally from outer lateral edges of the second dielectric sidewall spacers. Consequently, transistor 66 may be formed having shorter LDD regions 40. In this embodiment, silicide 54 may also be arranged on exposed portions of the semiconductor substrate 34 including only the source/drain regions 60 because substantially the entire LDD regions 40 are located beneath first dielectric sidewall spacers 46.

Figure 11:
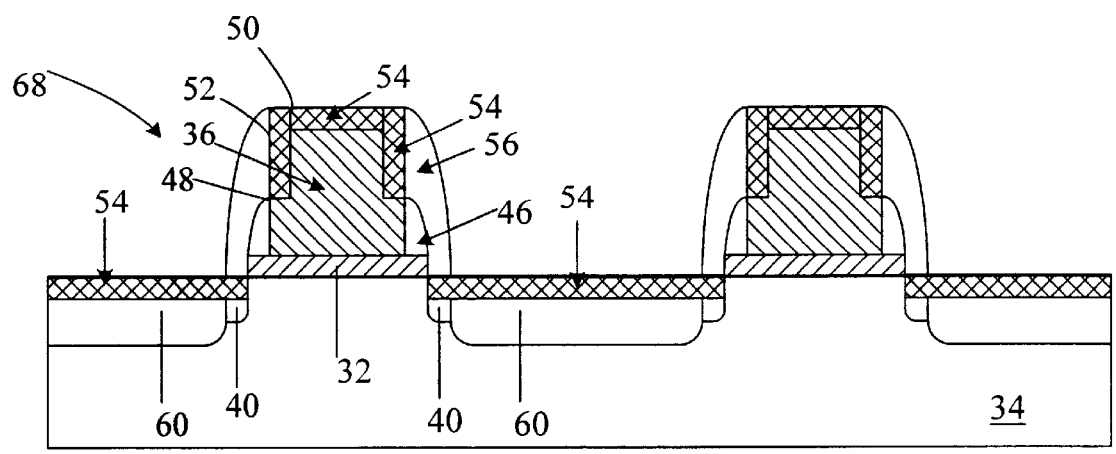
FIG. 11 depicts a partial cross-sectional view of a semiconductor topography in an alternative embodiment, in which LDD regions in the semiconductor substrate are laterally spaced from the polysilicon gate conductor, source/drain regions in the semiconductor substrate extend laterally from the second dielectric sidewall spacers, and silicide has been formed on exposed regions of the semiconductor substrate including LDD and source/drain regions.

In an alternative embodiment, shown in FIG. 11, LDD regions 40 may also be formed subsequent to forming first dielectric sidewall spacers 46. In this manner, LDD regions 40 may be formed within semiconductor substrate 34 laterally spaced from gate conductor 36 and self-aligned to the outer lateral edges of first dielectric sidewall spacer 46. Such lateral spacing of the LDD regions may be desirable in some embodiments, for example, to allow for subsequent diffusion of the LDD impurities. Silicide 54 may then be formed on exposed portions of the semiconductor substrate 34 including source/drain regions 60 and LDD regions 40. Additionally, in this embodiment, silicide 54 may also be formed prior to implanting LDD regions 40. Source/drain regions 60 may then be self-aligned to the outer lateral edges of the second dielectric sidewall spacers 56. Alternatively, source/drain regions 60 may also be implanted prior to formation of silicide 54. In an embodiment, source/drain regions 60 may be self-aligned to the outer lateral edges of second dielectric sidewall spacers 56 as above. Second dielectric sidewall spacers 56 may then be removed by an etch process leaving only first dielectric sidewall spacers 46. Silicide 54 may then be formed on source/drain regions 60 and LDD regions 40.

FIG. 11 also illustrates a transistor 68 formed according to an above embodiment. LDD regions 40 may be laterally spaced from the polysilicon gate conductor 36 and self-aligned to outer lateral edges of the first dielectric sidewall spacer 46. LDD regions 40 in the semiconductor substrate 34, therefore, may be located beneath only second dielectric sidewall spacers 56. Source/drain regions 60 in the semiconductor substrate 34 may extend laterally from outer surfaces of the second dielectric sidewall spacers 56. Consequently, a transistor 68 may have shorter LDD regions 40 that are laterally spaced from the gate conductor 36. Silicide 54 may be arranged on upper surfaces of both the LDD regions 40 and the source/drain regions 60 in this embodiment. In an alternative embodiment, second dielectric sidewall spacers 56 may not be included in transistor 68 if they were removed prior to salicidation.

In an additional embodiment, second dielectric sidewall spacers 56 may also be formed by anisotropically etching a dielectric layer such that an upper surface 72 (see FIGS. 12 and 13) of the second dielectric sidewall spacers 56 is lower than an upper surface 50 of gate conductor 36. In this manner, second dielectric sidewall spacers 56 may be formed prior to salicidation processing, and LDD regions 40 may be substantially masked during salicidation thereby preventing silicide 54 from forming on the LDD regions 40. In this embodiment, silicide 54 may be formed prior to or subsequent to implantation of the source/drain regions 60.

Figure 12:
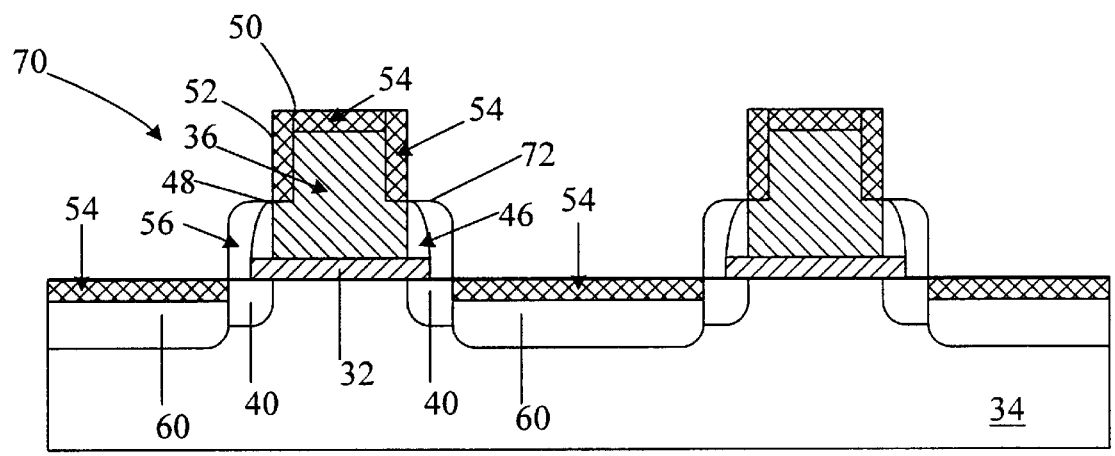
FIG. 12 depicts a partial cross-sectional view of a semiconductor topography in an alternative embodiment, in which LDD regions in the semiconductor substrate extend laterally from the polysilicon gate conductor, source/drain regions in the semiconductor substrate extend laterally from the second dielectric sidewall spacers, and silicide has been formed on exposed regions of the semiconductor substrate including only the source/drain regions.

FIG. 12 illustrates a transistor 70 formed according to an above embodiment. LDD regions 40 extend laterally from the gate conductor 36 in the semiconductor substrate 34 beneath the first and second dielectric sidewall spacers, 46 and 56, respectively. Source/drain regions 60 in the semiconductor substrate 34 may extend laterally from outer surfaces of the second dielectric sidewall spacers 56. Second dielectric sidewall spacers 56 may have an upper surface 72 that is lower than an upper surface 50 of gate conductor 36. Silicide 54 may be arranged on exposed portions of the semiconductor substrate 34 including only source/drain regions 60. Consequently, a transistor 70 may be formed having longer LDD regions 40 in semiconductor substrate 34 laterally extending from gate conductor 36 without having silicide 54 arranged on the upper surfaces of LDD regions 40.

Figure 13:
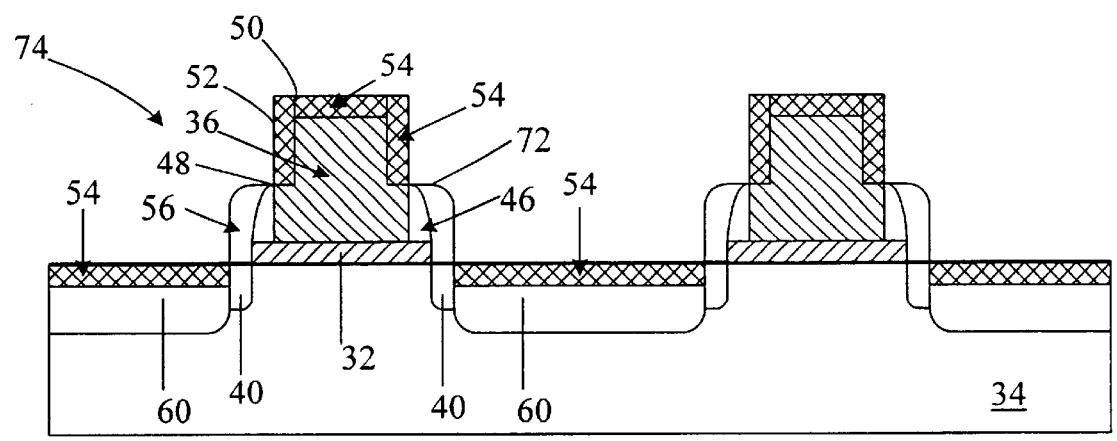
FIG. 13 depicts a partial cross-sectional view of a semiconductor topography in an alternative embodiment, in which LDD regions are laterally spaced from the polysilicon gate conductor, source/drain regions in the semiconductor substrate extend laterally from the second dielectric sidewall spacers, and silicide has been formed on exposed regions of the semiconductor substrate including only the source/drain regions.

FIG. 13 further illustrates an alternative transistor 74 formed according to an above embodiment. LDD regions 40 may be laterally spaced from the polysilicon gate conductor 36 and self-aligned to the outer lateral edges of first dielectric sidewall spacers 46. LDD regions 40, therefore, may be located in the semiconductor substrate 34 beneath only second dielectric sidewall spacer 56. Source/drain regions 60 in the semiconductor substrate 34 may extend laterally from outer lateral edges of the second dielectric sidewall spacers 56. Second dielectric sidewall spacers 56 may have an upper surface 72 that is lower than an upper surface 50 of gate conductor 36. Silicide 54 may also be arranged on exposed regions of semiconductor substrate 34 including only source/drain regions 60. Consequently, a transistor 74 having shorter LDD regions 40 laterally spaced from a polysilicon gate conductor 36 may be formed without having silicide 54 arranged on upper surface of LDD regions 40.

In the instance that silicide structures 54 and silicide gate conductor 36 comprise $TiSi_2$, the first pair of dielectric sidewall spacers 46, or the spacers which are exposed during the salicide process, are preferably composed of silicon nitride ("nitride") as opposed to oxide. The reactivity of Ti with $SiO_2$ to form both $TiSi_2$ and $TiO_2$ is relatively high, and may undesirably lead to the formation of an electrical short between gate conductor 36 and source/drain regions 60. However, the reaction between Ti and $Si_3N_4$ is less favorable. As such, a silicide bridge is less likely to form upon nitride spacers than upon oxide spacers. Fabricating sidewall spacers 46 from oxide is possible if the spacer thickness is sufficient to prevent $TiSi_2$ from forming immediately adjacent the sidewall spacers 46 of the gate conductor 36. Because Co does not readily react with oxide or nitride, relatively thin sidewall spacers 46 composed of either nitride or oxide may be used if $CoSi_2$ is being formed.

It will be appreciated to those skilled in the art having the benefit of this disclosure that this invention is believed to provide a method for forming silicide simultaneously on top and sidewall surfaces of a gate conductor and on junction regions in a semiconductor substrate. Further modifications and alternative embodiments of various aspects of the invention will be apparent to those skilled in the art in view of this description. For example, the methods described herein could be applied not just to transistors, but to related devices such as memory cells. It is intended that the following claims be interpreted to embrace all such modifications and changes and, accordingly, the specification and drawings are to be regarded in an illustrative rather than a restrictive sense.

What is claimed is:

1. A semiconductor device, comprising:
   a polysilicon gate conductor dielectrically spaced above a semiconductor substrate;
   a first pair of dielectric sidewall spacers adjacent to and laterally extending from the polysilicon gate conductor, wherein the first pair of dielectric sidewall spacers has an upper surface that is lower than an upper surface of the polysilicon gate conductor;
   a second pair of dielectric sidewall spacers adjacent to and laterally extending from the first pair of dielectric sidewall spacers and exposed sidewall surfaces of the polysilicon gate conductor, wherein the second pair of dielectric sidewall spacers is in contact with sidewall surfaces of the first pair of dielectric sidewall spacers farthest from the polysilicon gate conductor; and
   a silicide arranged on the exposed sidewall surfaces of the polysilicon gate conductor above the upper surface of the first pair of dielectric sidewall spacers, on a top surface of the polysilicon gate conductor, and on exposed portions of the semiconductor substrate.

2. The semiconductor device of claim 1, wherein a height of the exposed sidewall surfaces of the polysilicon gate conductor is approximately two-thirds of a total gate height.

3. The semiconductor device of claim 1, wherein a height of the first pair of dielectric sidewall spacers is greater than approximately a length that substantially prevents silicide shorting between the polysilicon gate conductor and junction regions in the semiconductor substrate.

4. The semiconductor device of claim 1, wherein the second pair of dielectric sidewall spacers has an tipper surface that is lower than the upper surface of the polysilicon gate conductor.

5. The semiconductor device of claim 1, wherein the second pair of dielectric sidewall spacers comprises a material exhibiting etch selectivity towards said first pair of dielectric sidewall spacers.

6. The semiconductor device of claim 1, further comprising lightly doped drain regions within the semiconductor substrate spaced below the first pair of dielectric sidewall spacers and heavily doped source and drain regions within the semiconductor substrate laterally extending from the lightly doped drain regions and beneath said silicides formed on exposed portions of the semiconductor substrate.

7. The semiconductor device or claim 1, further comprising lightly doped drain regions within the semiconductor substrate spaced below the first and second pairs of dielectric sidewall spacers and heavily doped source and drain regions within the semiconductor substrate laterally extending from the lightly doped drain regions and beneath said silicides formed on exposed portions of the semiconductor substrate.

8. The semiconductor device of claim 1, further comprising lightly doped drain regions within the semiconductor substrate spaced below the second pair of dielectric sidewall spacers and heavily doped source and drain regions within the semiconductor substrate laterally extending from the lightly doped drain regions and beneath said slicides formed on exposed portions of the semiconductor substrate.

9. The semiconductor device of claim 1, further comprising lightly doped drain regions within the semiconductor substrate laterally spaced front the polysilicon gate conductor.

10. The semiconductor device of claim 1, further comprising lightly doped drain regions within the semiconductor substrate, wherein the silicide is not formed on the lightly doped drain regions.

11. The semiconductor device of claim 1, wherein the second pair of dielectric sidewall spacers comprises silicon nitride.

12. The semiconductor device of claim 1, wherein the first pair of dielectric sidewall spacers is spaced from the silicide arranged on the exposed portions of the semiconductor substrate.

13. The semiconductor device of claim 1, wherein the second pair of dielectric sidewall spacers is formed upon at least a portion of uppermost surfaces of the first pair of dielectric sidewall spacers.

14. The semiconductor device of claim 1, wherein the second pair of dielectric sidewall spacers is formed upon entire uppermost surfaces of the first pair of dielectric sidewall spacers.

15. A semiconductor device, comprising:
a polysilicon gate conductor dielectrically spaced above a semiconductor substrate;
a first pair of dielectric sidewall spacers adjacent to and laterally extending from the polysilicon gate conductor, wherein the first pair of dielectric sidewall spacers has an upper surface that is lower than an upper surface of the polysilicon gate conductor;
a second pair of dielectric sidewall spacers adjacent to and laterally extending from the first pair of dielectric sidewall spacers and exposed sidewall surfaces of the polysilicon gate conductor, wherein an entire lowermost surface of the second pair of dielectric sidewall spacers is not formed upon the first pair of dielectric sidewall spacers; and
a silicide arranged on the exposed sidewall surfaces of the polysilicon gate conductor above the upper surface of the first pair of dielectric sidewall spacers, on a top surface of the polysilicon gate conductor, and on exposed portions of the semiconductor substrate.

* * * * *

UNITED STATES PATENT AND TRADEMARK OFFICE
CERTIFICATE OF CORRECTION

PATENT NO.    : 6,630,721 B1
DATED         : October 7, 2003
INVENTOR(S)   : Ligon It is certified that error appears in the above-identified patent and that said Letters Patent is hereby corrected as shown below:

<u>Column 14,</u>
Line 50, please delete "tipper" and insert -- upper -- in place thereof.

<u>Column 15,</u>
Line 14, after "spaced", please delete "front" and insert -- from -- in place thereof.

Signed and Sealed this

Thirtieth Day of December, 2003

JAMES E. ROGAN
*Director of the United States Patent and Trademark Office*